(12) United States Patent
Bergmann et al.

(10) Patent No.: US 7,006,356 B2
(45) Date of Patent: Feb. 28, 2006

(54) DRIVING SYSTEM WITH CONVERTER CONTROL FOR LOW-VOLTAGE THREE-PHASE MOTORS

(75) Inventors: Ulf Bergmann, Wakendorf II (DE); Nils-Peter Hansen, WFockstrasse (DE); Frank Hörmann, Westensee (DE); Benjamin Jonas, Henstedt-Ulzburg (DE); Michael Knieriem, Norderstedt (DE); Olaf Lenz, Hamburg (DE); Rüdiger Schwarz, Quickborn (DE)

(73) Assignee: Jungheinrich Aktiengesellschaft, Hamburg (DE)

( * ) Notice: Subject to any disclaimer, the term of this patent is extended or adjusted under 35 U.S.C. 154(b) by 205 days.

(21) Appl. No.: 10/429,287

(22) Filed: May 2, 2003

(65) Prior Publication Data

US 2004/0022041 A1    Feb. 5, 2004

(30) Foreign Application Priority Data

May 4, 2002    (DE)    ................................. 102 20 047

(51) Int. Cl.
*H05K 1/14*    (2006.01)
(52) U.S. Cl. ...................... 361/736; 361/792; 361/748; 318/185
(58) Field of Classification Search ................ 361/736, 361/760, 730, 748, 792, 715, 752, 818, 794, 361/800; 312/223.1, 223.2; 318/468, 266, 318/185, 187
See application file for complete search history.

(56) References Cited

U.S. PATENT DOCUMENTS 4,218,724 A * 8/1980 Kaufman .................... 361/736
4,908,738 A * 3/1990 Kobari et al. ............... 361/829
5,933,343 A    8/1999 Lu et al. ...................... 363/144
6,578,260 B1 * 6/2003 Dixon et al. .................. 29/830

FOREIGN PATENT DOCUMENTS

| DE | 43 33 387 | 3/1994 |
|---|---|---|
| DE | 197 20 695 | 11/1998 |
| DE | 198 47 029 | 4/2000 |
| DE | 199 10 787 | 9/2000 |
| DE | 101 07 711 | 8/2001 |

* cited by examiner

*Primary Examiner*—Randy W. Gibson
*Assistant Examiner*—Hung S. Bui
(74) *Attorney, Agent, or Firm*—Vidas, Arrett & Steinkraus, P.A.

(57) ABSTRACT

Driving system with converter control for low voltage three-phase motors, which is provided with a power unit containing transistors and capacitors, a triggering unit for the transistors and a control unit as well as connections for direct and alternating current, the units being disposed in a common casing made of a heat-conductive material, characterised by the following features: the power unit is provided with a first printed circuit board (24) made of fairly heat-conductive material, which is disposed on the fairly heat-conductive bottom of the casing (12) in a plane fitting arrangement, a second printed circuit board (26) contains the triggering unit, the second printed circuit board (26) being electrically and mechanically connected to the first printed circuit board (24) in a spacing to it with the aid of contact pins (30) of metallic material attached on the first printed circuit board (24) by soldering, and terminal pins (22) are connected with contact points (38) of the first printed circuit board (24) and lead through openings in the second printed circuit board (26) as well as in the cover (14) in an insulated manner.

20 Claims, 10 Drawing Sheets

DRIVING SYSTEM WITH CONVERTER CONTROL FOR LOW-VOLTAGE THREE-PHASE MOTORS

CROSS-REFERENCE TO RELATED APPLICATIONS

Not Applicable.

STATEMENT REGRDING FEDERALLY SPONSORED RESEARCH

Not Applicable.

BACKGROUND OF THE INVENTION

When using three-phase motors for battery-operated floor conveyors a transformer is naturally required, which generates the three-phase alternating voltage from the battery voltage. The transformer conveniently contains three half-bridges, in each of which two semiconductor switches in the form of power transistors are disposed, for instance MOS-FETs or also IGBT. The transformer has a power unit with power transistors for the generation of a three-phase output alternating voltage, a capacitor battery as a buffer capacity and a triggering electronics for the power transistors. Further, a control unit is provided which has a computing unit with appendant software. Power transistors as well as control units are conveniently disposed on one circuit mounting plate. The power transistors generate considerable heat, which has to be discharged onto the surroundings with the aid of corresponding cooling attachments or the like.

From DE 197 20 695 a transformer has become known, in which all the power transistors are arranged on a first current bar as parallel connected semiconductor branches of the three-phase bridge, and the power transistors of the respective other half-branch of the bridge are disposed on a separate current bar per phase, on which the respective phase voltage is picked up. The power transistors are in direct thermal contact with the current bars, which are part of a cooling attachment at the same time.

From DE 199 10 787 a transformer has become known, in which the cooling attachment is provided with three oblong portions disposed parallel in a distance, the transistors of each phase being attached alternately side by side in an insulated manner on one portion. Mounting plate portions are disposed in the two compartments between the cooling attachment portions, with which the transistors and the capacitors of the capacitor battery are connected, the mounting plate portion disposed in the wider compartment having two rows of transistors. Near to the rows of transistors an arrangement of three parallel current bars running in a distance is provided, respectively, of which a first current bar is provided for one phase, a second current bar for the minus potential and a third current bar for the plus potential.

The invention has as an objective to provide a driving system with converter control for three-phase motors, in which a high power density is obtained at relatively low manufacturing expenditure.

BRIEF SUMMARY OF THE INVENTION

In the inventive driving system, the power unit has a first printed circuit board which consists of a fairly heat-conductive material and which is disposed on the fairly heat-conductive bottom of the casing in a plane fitting arrangement. The material of the first printed circuit board is electrically insulating in fact, but is of such a nature that a good heat conductivity exists. Thus, the first printed circuit board may consist of an aluminium powder that is compounded with plastic material, whereby heat can be discharged in plane contact to the fairly heat-conductive bottom of the casing. The interconnection traces in the first printed circuit board can be disposed such that they have plane contact to the bottom of the casing on their part. In this case, the casing bottom must not be electrically conductive. The casing can be made from a fairly heat-conductive material, e.g. aluminium which is formed by the diecasting method.

On the first printed circuit board the power transistors are disposed as well as a series of contact or connecting pins, which are soldered on the circuit board and which mechanically and electrically connect the first printed circuit board with the second printed circuit board, which is disposed parallel and in a distance above the first printed circuit board. On the second printed circuit board there is arranged the so-called triggering unit for the power transistors as well as the required capacitor battery. Reference is made in this to the disclosure of DE 199 10 787, where a bridge circuitry for a transformer is presented. The second printed circuit board consists of a different base material, e.g. of glass fiber reinforced plastic material which is provided with copper linings or the like. The contact pins extend through openings of the second printed circuit board and are preferably soldered in these openings, so that a solid mechanical joint is also established in this manner. Preferably the arrangement of first printed circuit board and second printed circuit board is formed as a sandwich assembly, which can be attached to the bottom of the casing by screwing.

On the first printed circuit board are also located the contact points for the alternating and direct current connections, with terminal pins being provided which are attached to these connections and which are lead through via openings in the second printed circuit board and the cover of the casing.

A transformer of the described type requires beyond that a so-called control unit, which is preferably also disposed within the casing, namely on the bottom side of the cover, the control unit being connected to the circuitry of the second printed circuit board via a cable, for instance a flat ribbon cable. With the latter measure a standardisation of the interface to the control unit is established. The power unit can be provided for different voltage classes by change of assembly parts.

With the aid of the invention the first printed circuit board can be manufactured all automatically, especially by the so-called SMD (service mounted device) method. The second printed circuit board can be assembled widely automatically also.

The inventive form of the driving system with a converter unit makes possible an excellent carrying off of the heat of the power transistors and through this a high power density, which leads to a corresponding saving of space and a compact construction.

According to one form of the invention, the contact pins soldered on the first printed circuit board can be made of a springable yielding material and can have an outward bend or another design in the bottom region, such that the contact pins springably yield upon axial charge. Thus, the contact pins may have an s-shape in the bottom region, for instance.

According to another form of the invention, the contact pins are provided with an enlargement between the ends, on which a frame between first and second printed circuit board is supported, the pins extending in the upward direction through openings in the frame. The frame has a stabilisation and alignment function, so that the upper ends of the contact pins are in the prescribed arrangement relatively accurate to size, when the second printed circuit board is placed upon. In this way it is possible to attach the second printed circuit board all automatically, the upper ends of the contact pins overhanging through the openings in the second printed circuit board and being soldered therein.

According to another form of the invention, the contact points on the first printed circuit board are formed by sockets or pivots, which are soldered on the first printed circuit board in plane fitting, e.g. by the SMD-method. The terminal pins are provided with a sleeve portion, which is pushable up to the socket. By the fact that the terminal pin is pushed up to the socket, the pin can yield in the rotational as well as in the axial direction, so that forces acting upon the terminal pin are not transferred to the first printed circuit board. For better mechanical attachment of the terminal pins in the cover, one form of the invention provides for a portion of the cover to consist of plastic material, in the openings of which the upper ends oft the terminal pins are fixedly arranged. Preferably this plastic material portion is cast into a recess or an indentation of the cover. The terminal pins can be provided with a radial flange, which engages into a recess of the cover portion so that it is secured against rotation. A ring nut can co-operate by an external thread with an internal thread of the recess, and thus tighten the flange against the bottom of the recess. In order to avoid any reverse rotation of the ring nut, it can be provided with an outer toothing, preferably a saw-toothing, which co-operates with the wall of the recess in the cover portion in order to avoid any reverse rotation.

BRIEF DESCRIPTION OF THE SEVERAL VIEWS OF THE DRAWINGS

The invention will be clarified in more detail by means of a realisation example below.

DETAILED DESCRIPTION OF THE INVENTION

While this invention may be embodied in many different forms, there are described in detail herein a specific preferred embodiment of the invention. This description is an exemplification of the principles of the invention and is not intended to limit the invention to the particular embodiment illustrated.

Figure 1:
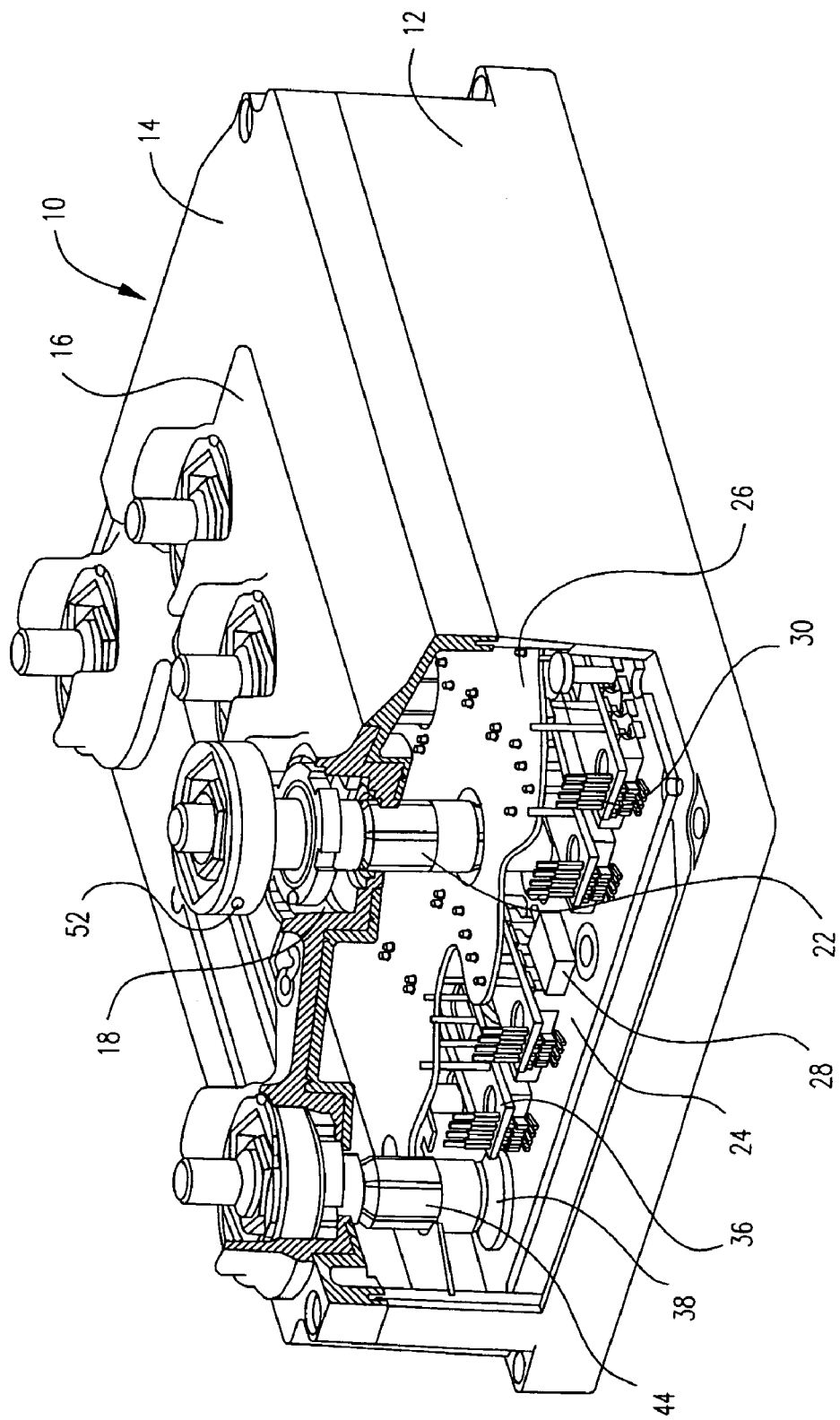
FIG. 1 shows a transformer unit according to the invention, broken-up and in perspective.

FIG. 1, a driving system with a transformer is generally denomitated with 10. It is provided with a casing with a casing bottom portion 12 and a cover 14. The cover co-operates in a sealing manner with the casing bottom portion, the cover 14 being screwed together with the casing bottom portion 12, to which is not incurred in detail, however.

Casing bottom portion 12 and cover 14 are formed by aluminium die casting, for instance, but in particular by a fairly heat conductive material. In an upper recess or indentation of the cover 14 a portion 16 of plastic material is injected. The portion 16 is provided with five recesses or indentations, one of which can be particularly well recognised at 18. The bottom of the recess 18 is provided with an opening, which corresponds to an opening in a depression 20 of the cover 14. Through these openings, a terminal pin 22 extends in the upward direction. A total of five terminal pins 22 are provided. The two terminal pins disposed on the left border of the cover 14 in FIG. 1 form the connection for direct current which is delivered from a battery (not shown). The three terminal pins 22 arranged in series parallel to the latter form the three-phase current outputs, which are connected to a not shown three-phase ac motor of a floor conveyor. The fixation of the terminal pins 22 will still be described below. The terminal pin tagged with the index 22 and its fixation, respectively, is represented in an assembly phase, i.e. the parts used for them are not yet on their definite place, as is shown with respect to the other contact pins.

In FIG. 1 a first printed circuit board 24 can be easily recognised and a second printed circuit board 26, which is arranged parallel and in a distance above the first printed circuit board 24.

Figure 2:
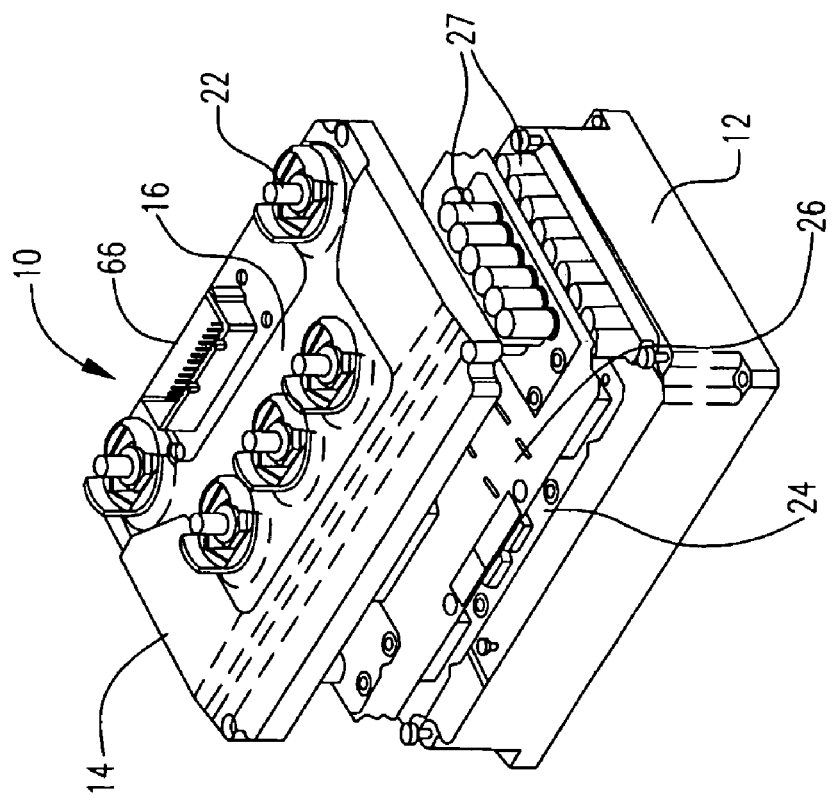
FIG. 2 shows the unit according to FIG. 1 in an extended representation, also in perspective.
Figure 3:
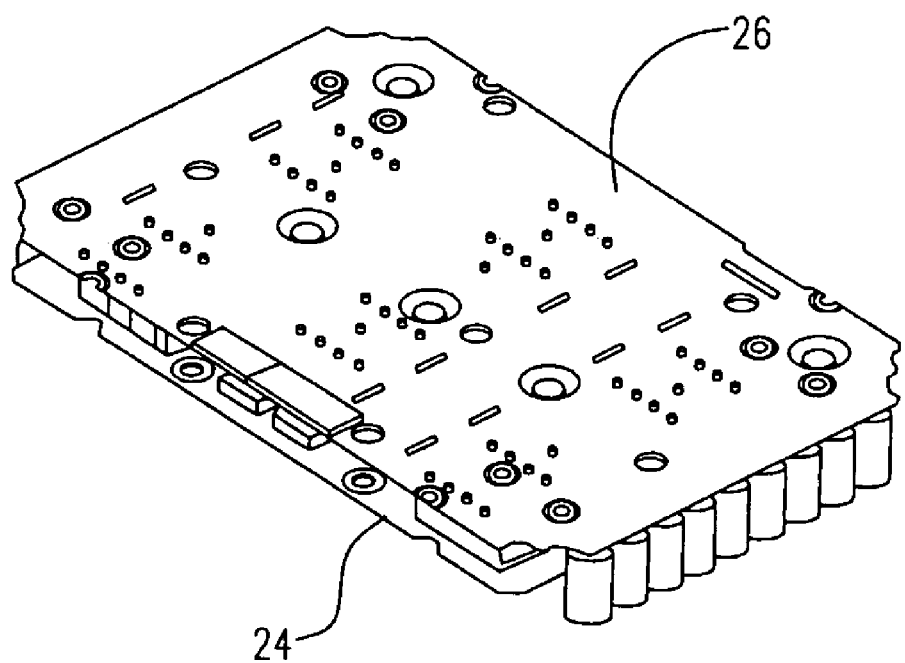
FIG. 3 shows the sandwich assembly of first and second printed circuit board of the transformer unit according to FIGS. 1 and 2.
Figure 5:
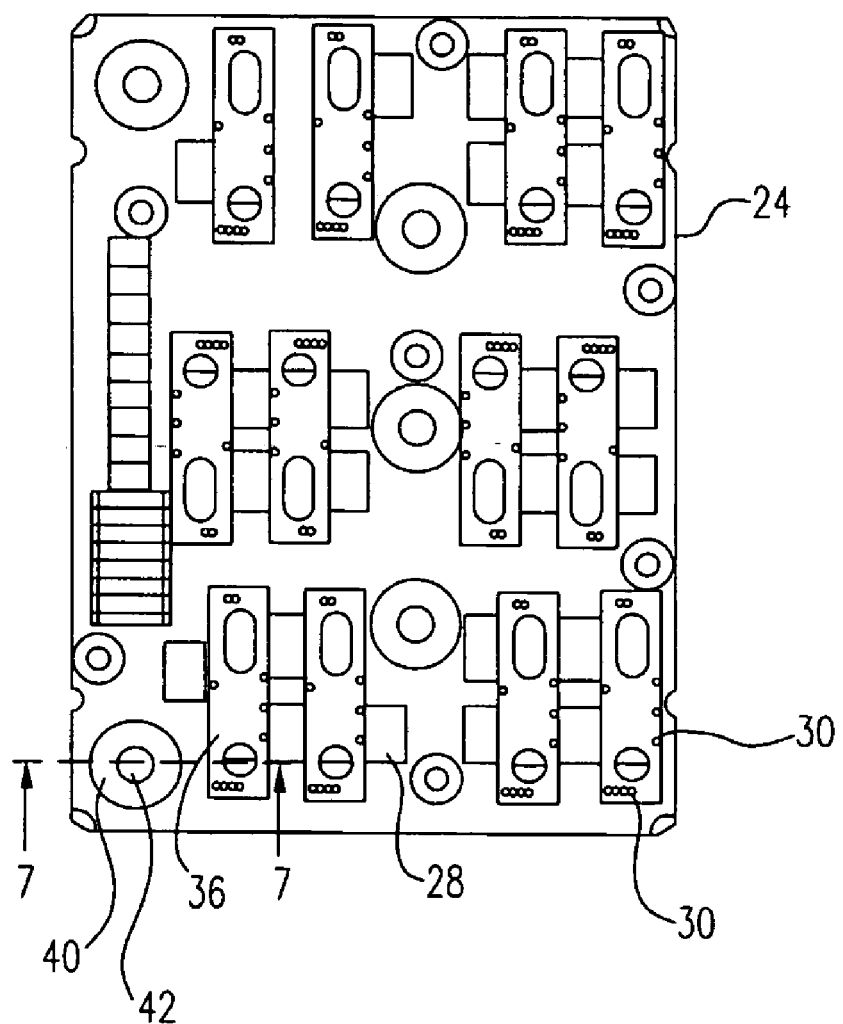
FIG. 5 shows the top view of the first printed circuit board of the sandwich assembly according to FIG. 3.
Figure 6:
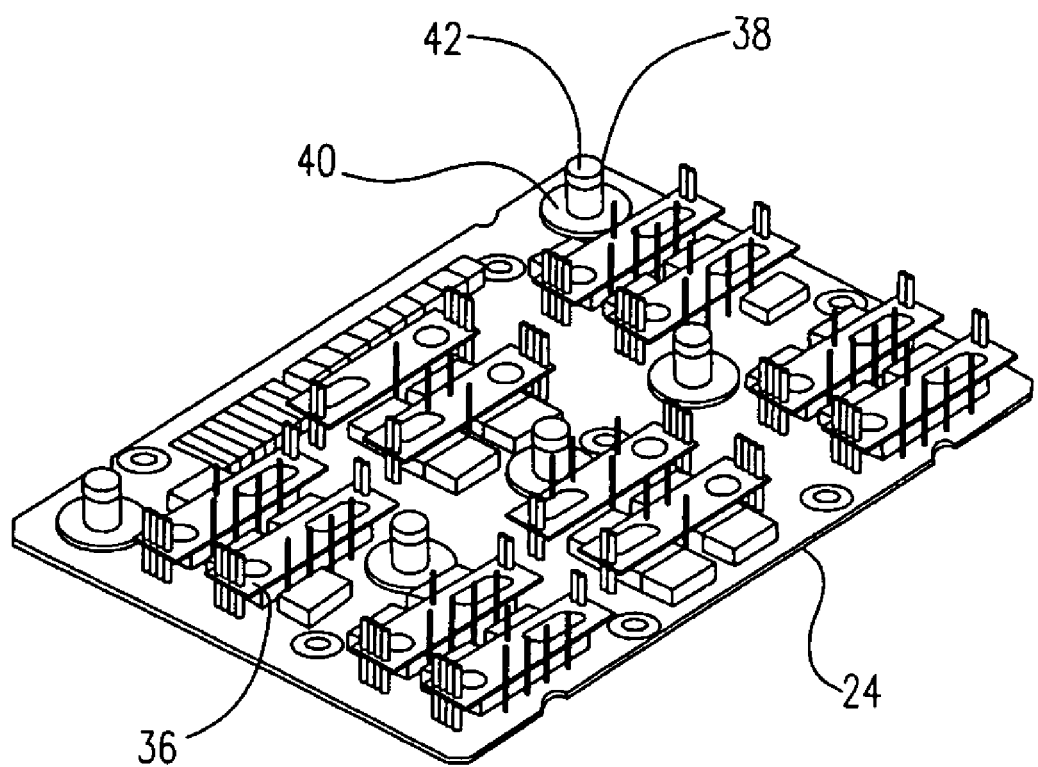
FIG. 6 shows the first printed circuit board according to FIG. 5 in perspective.
Figure 7:
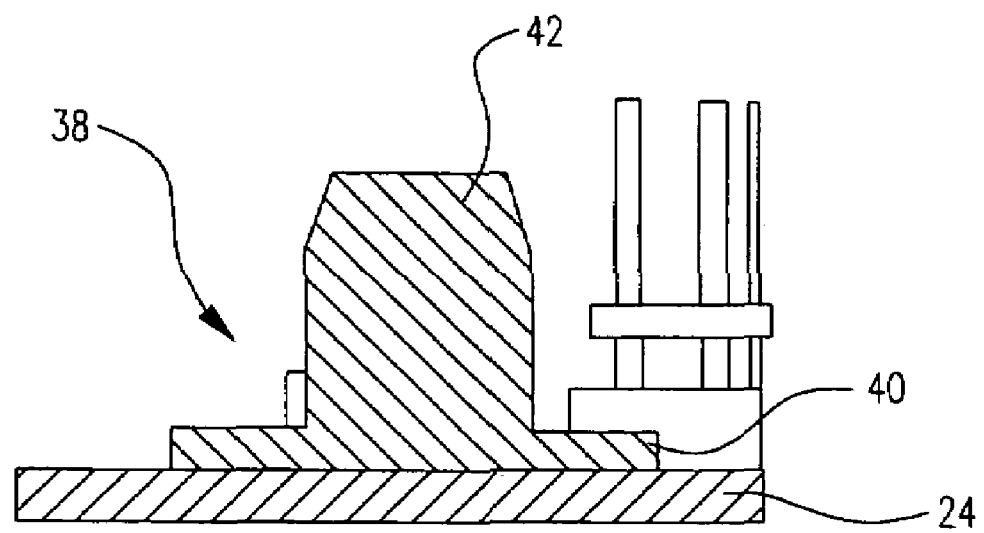
FIG. 7 shows a section through the printed circuit board along the line 7—7.
Figure 8:
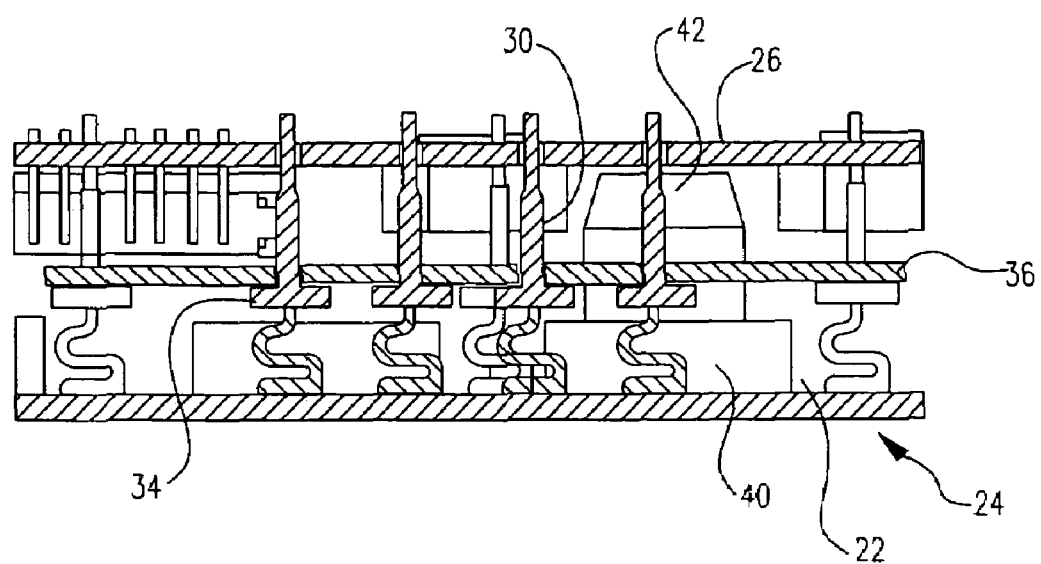
FIG. 8 shows a partial section through the first and second printed circuit board according to FIG. 3

As emerges from FIGS. 2 and 3, the printed circuit boards 24, 26 form a sandwich assembly. The substrate material of the printed circuit board 24 consists of e.g. aluminium which is compounded with plastic material, whereas that for the printed circuit board 26 consists of glass fiber reinforced plastic material. Especially the printed circuit board 24 is fairly heat-conductive. It is applied in a plane manner to the bottom of the casing portion 12, as can be recognised from FIG. 1, so that a good carrying off of heat can be achieved, because the first printed circuit board 24 contains the power unit of the transformer, particularly the power transistors, which are soldered on the printed circuit board 24, as is shown at 28 in the form of little boxes, for instance. Contact pins are also soldered on the first printed circuit board 24, namely group-wise or separately, as can be recognised at 30. The attachment of the contact pins and their forms emerges in more detail from FIG. 8. The flat contact pins 30 formed from sheet metal are bent in an s-shape on the bottom end, the bottom branch of the s being soldered on the printed circuit board 24 in a plane across a larger range. Upside the s-form the contact pins 30 are provided with an enlargement 34, on which a frame 36 is seated, through the holes of which the contact pins 30 extend in the upward direction. Such frames can be recognised in the FIGS. 1, 5 and 6, for instance. These frames have the objective to maintain the numerous contact pins of a contact pin arrangement in a determined alignment, because the upper printed circuit board 26 is disposed such that the upper ends of the contact pins 30 extend through corresponding holes of the printed circuit board 26, as can be clearly recognised in FIG. 8 but also in FIG. 1. The contact pins 30 are soldered with the upper printed circuit board 26 in the known manner, by which corresponding connections with the interconnection traces of the second printed circuit board 26 are produced. The contact pins 30 are connected with interconnection traces of the first printed circuit board 24, which on their part are lead to the transistors. In this way the second printed circuit board 26 is not only electrically but also mechanically connected to the first printed circuit board 24 for the formation of the sandwich assembly according to FIGS. 2 and 3. The particular form of the contact pins 30 makes a vibration-reduced support of the second printed circuit board 26 possible, so that vibrations do not directly act upon the soldering points.

Five sockets 38 are disposed on the first printed circuit board 24. They are provided with a flange 40, which is soldered to the first printed circuit board 24 in a plane. A pivot 42 extends from the flange 40 in the upward direction. The sockets 38 form the connections for the terminal pins 22 for direct and alternating current. The transistors as well as the sockets 38 can be attached to the first printed circuit board 24 by a so-called SMD (Service Mounted Device) method, which can take place all automatically. The second printed circuit board 26 comprises the so-called triggering unit for the power semiconductors, the second printed circuit board being also producible almost all automatically by the SMD-Method. It is not incurred to further to the assembly of the second printed circuit board. The capacitors 27 should be mentioned, however. The bottom ones are fixed on the second printed circuit board and the upper ones on two extra mounting plates, which are connected by a screw joint to the second printed circuit board.

Figure 9:
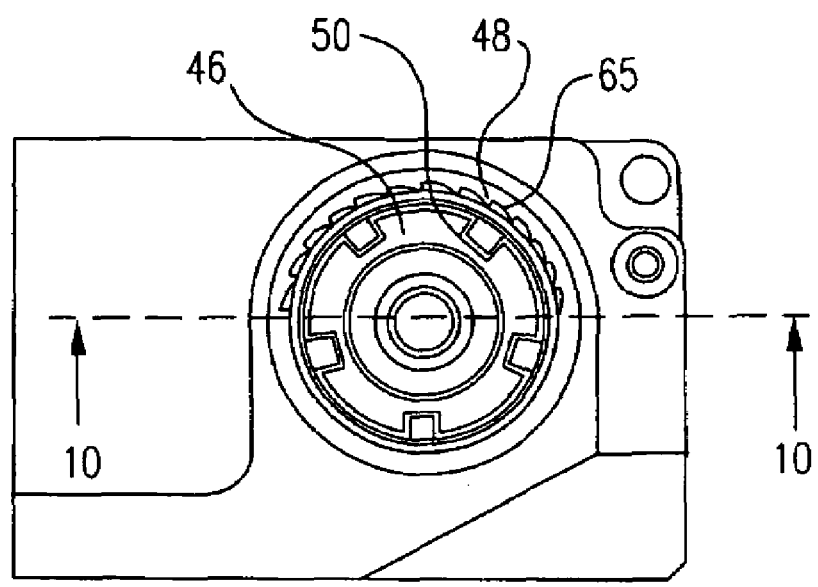
FIG. 9 shows the top view of a portion of the cover of the transformer unit along the line 10—10.
Figure 10:
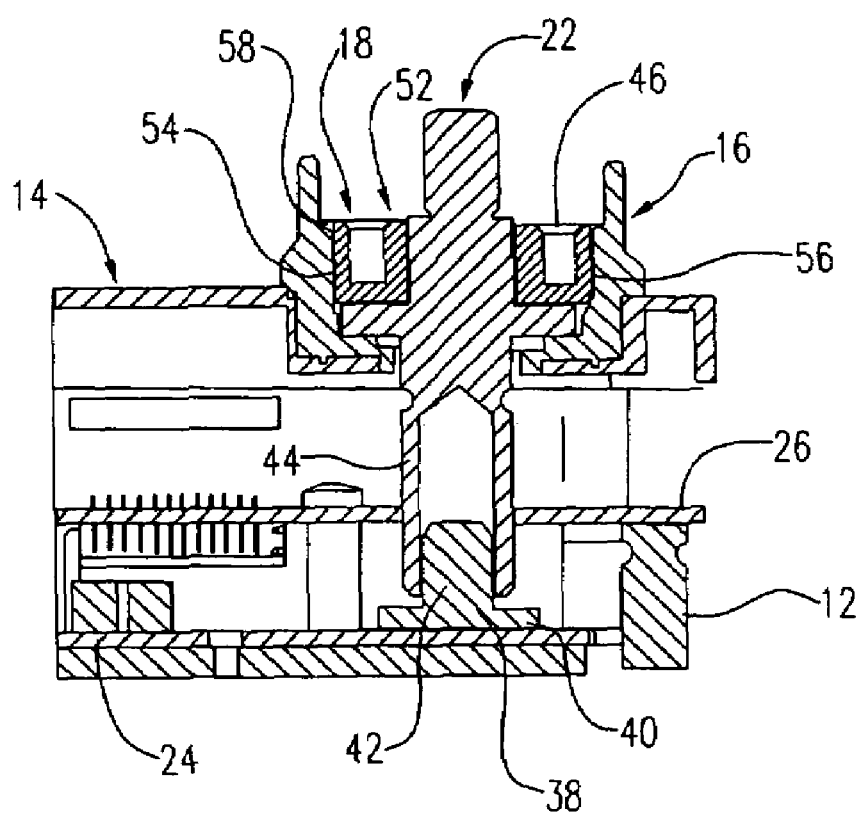
FIG. 10 shows a section through the delineation according to FIG. 9 along the line 10—10.

As can be seen particularly from FIG. 10, the terminal pin 22 has a sleeve portion 44 on the bottom end, which is formed such that it can be pushed up on the pivot 42 in order to establish an electrical connection. To do this, the sleeve portion 44 may be formed in a corresponding manner, which shall not be described in detail, however. Above the sleeve portion 44 the terminal pin 22 is solid, and between the ends it is provided with a flange 46. The flange 46 is situated upside of an opening in the recess 18 of the cover portion 16 or an opening in the cover 14, respectively. Above this opening is situated the recess 18, as already described, which is approximately circular and is provided with five radially projecting parts 48 disposed in equal perimeter spacing on its bottom part, which co-operate with correspondingly formed recesses 50 of the flange 46 in order to secure the latter against rotation (see especially FIG. 9). The fixation of the terminal pin 22 in the cover portion 16 takes place with the aid of a straining ring nut 52, which is provided with an external thread 54, which co-operates with an internal thread 56 in the recess 18. Through this the flange 46 can be strained against the bottom of the recess and also be fixed in its angular position. The straining ring 52 is provided on its upper end with a radial flange 58 pointing in the outward direction which is provided with a saw-toothing 60, as can be recognised in FIG. 9. The saw toothing co-operates with the opposing wall of the recess 18, whereby the straining ring 52 is secured against rotation and can not self-acting unscrew itself.

It is recognised from FIGS. 9 and 10 that all the forces acting upon the contact pin 22, like bending and axial forces but also torques, which do appear when attaching a cable lug, for instance, are not transferred to the terminal socket 38, so that the soldered connection is not endangered.

Figure 4:
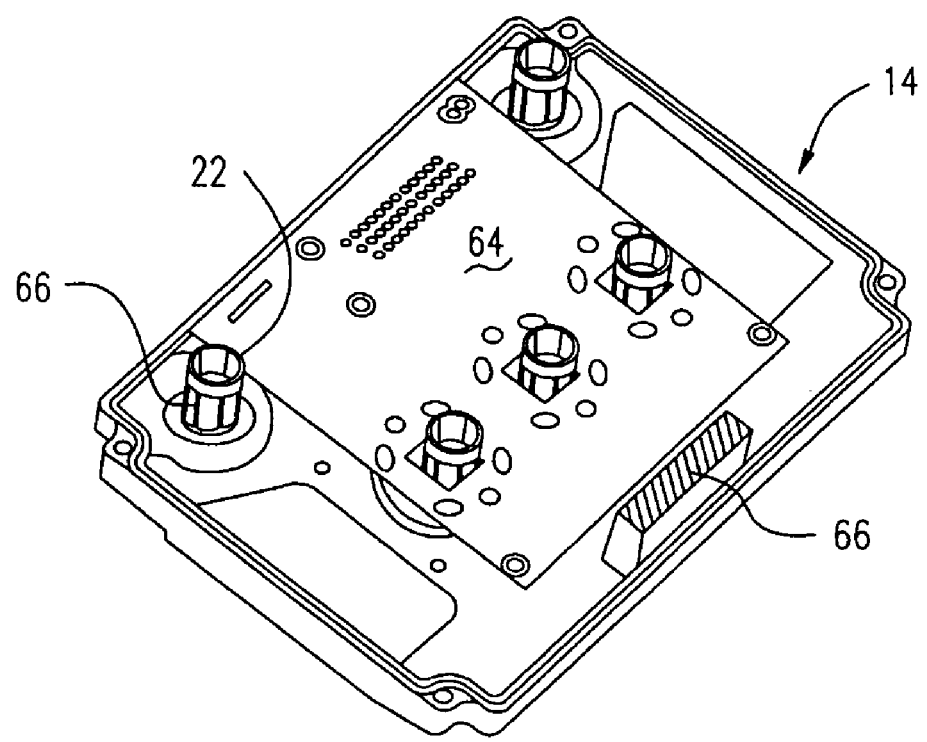
FIG. 4 shows the bottom side of the cover of the unit according to FIG. 1 or 2 in perspective.

As can be recognised from FIG. 4, a third printed circuit board 64 is attached to the bottom side of the cover 14 by screwing. This third printed circuit board 64 contains the control unit for the triggering unit, which is located on the second printed circuit board 26. On the cover 14 there is also mounted a connection for a flat ribbon cable (not shown). The connection is electrically connected via a flat ribbon cable with the second printed circuit board 26 (not shown in detail). On the second printed circuit board 26 an analogous connection is located (not shown) in order to establish a connection between the control and triggering units on the third and second printed circuit board 64, 26 via the not shown flat ribbon cable. 66 serves to the discharge of heat of a circuitry component of the circuit mounting plate 26 situated thereunder as a kind of cooling unit.

The attachment of the cover 14 on the casing portion 12 takes place by a screwing, as already described. The sandwich assembly of first and second printed circuit board according to FIG. 3 is also fixed on the bottom of the casing porting 12 with the aid of screws.

A number of advantages is obtained with the delineated transformer system. For instance, the power module, which is built on an IMS (Intelligent Manufacturing System) base, can be assembled all automatic with the aid of SMD technology. The second printed circuit board 26 can also be assembled for the most part via SMD. The sandwich assembly made from the first and the second printed circuit board allows for an optimal economy of space. The delineated association of the power connections is thermally optimal. Further, a mechanical uncoupling and adaptation of the sandwich assembly is obtained by means of the outlined plug-in system, whereby a compensation of all the vertical and horizontal tolerances is also achieved. Torques which occur on the terminal pins are absorbed by the cover and do not reach the sandwich assembly. A vibration-reducing and a thermal uncoupling takes place between the printed circuit board and the triggering printed circuit board. Furthermore, the electromagnetic noise transmission concerning the so-called electromagnetic compatibility is reduced and the electromagnetic irradiation resistance is optimised.

The above examples and disclosure arte intended to be illustrative and not exhaustive. These example and description will suggest many variations and alternatives to one of ordinary skill in this art. All these alternatives and variations are intended to be included within the scope of the attached claims. Those familiar with the art may recognize other equivalents to the specific embodiments described herein which equivalents are also intended to be encompassed by the claims attached hereto.

What is claimed is:

1. A converter control for low voltage three-phase motors for a driving system, comprising:
   a power unit containing transistors and capacitors,
   a triggering unit for the transistors, and a control unit as well as connections for direct and alternating current, the units being disposed in a common casing made of a heat-conductive material, the casing having a bottom and a separate cover, the power unit being provided with a first printed circuit board (24) made of fairly heat-conductive material, which is disposed on the fairly heat-conductive bottom of the casing (12) in a plane fitting arrangement; a second printed circuit board (26) containing the triggering unit, being electrically and mechanically connected to the first printed circuit board (24) in a spacing to it with the aid of contact pins (30) of metallic material attached on the first printed circuit board (24) by soldering, and terminal pins (22) connected with contact points (38) of the first printed circuit board (24) and leading through openings in the second printed circuit board (26) as well as in the cover (14) in an insulated manner, and the contact pins (30) are at least partially constructed out of a springy material and are formed in an axially yielding configuration in the vicinity of its mountings.

2. The converter control of claim 1, where the first printed circuit further comprises interconnection traces and the interconnection traces of the first printed circuit board (24) sit closely on the bottom of the casing (12).

3. The converter control of claim 1, characterized in that casing (12) and cover (14) are formed from aluminum.

4. The converter control of claim 1, characterized in that the contact pins (30) are soldered on the first printed circuit board (24) and are fixedly soldered into holes of the second printed circuit board on their upper ends.

5. The converter control of claim 1, characterized in that the springy material is formed into an axially yielding configuration by an outward bend.

6. The converter control of claim 1, characterized in that first and second printed circuit board (24, 26) form a sandwich assembly.

7. The converter control of claim 1, characterized in that the terminal pins (22) are partially movable with respect to the points of connection (38) and are mechanically fixed in openings of the cover (14).

8. The converter control of claim 1, characterized in that the contact points are formed by sockets (38), which are soldered on the first printed circuit board (24) in a plane-fitting manner, and that the terminal pins (22) do have a sleeve portion (44) which is pushable up to a socket (42).

9. The converter control of claim 1, characterized in that a portion (16) of the cover (14) consists of plastic material, in the openings of which are fixedly attached the upper ends of the terminal pins (22).

10. The converter control of claim 9, characterized in that the portion (16) is disposed in a recess of the cover (14), preferably by the plastic material injection moulding method.

11. The converter control of claim 9, characterized in that the terminal pins (22) are provided with a radial flange (46), which engages into a recess (18) of the cover portion (16) in a rotationably fixed manner, and that a ring nut (52) co-operates with a thread in the recess (18) and can be brought into bearing with the flange (46).

12. The converter control of claim 11, characterized in that the ring nut (52) is provided with an outer flange (58) which has a saw-tooth form (60) on its perimeter which co-operates with an interior portion of the recess (18) in order to secure the ring (52) against rotation.

13. The converter control of claim 9, characterized in that the recess (18) in the cover portion (16) is formed in a downward-directed projection of the cover portion (16), which on its part engages into an indentation in the cover (14).

14. A converter control for low voltage three-phase motors for a driving system comprising:
a power unit containing transistors and capacitors, a triggering unit for the transistors, a control unit, and connections for direct and alternating current, the units being disposed in a common casing made of a heat conductive material;
the power unit being provided with a first printed circuit board made of a fairly heat conductive material, which is disposed on the fairly heat conductive bottom of the casing in a plane fitting arrangement;
a second printed circuit board containing the triggering unit being electrically and mechanically connected to the first printed circuit board in a spacing to it with the aid of contact pins of metallic material attached on the first printed circuit board by soldering;
terminal pins which are connected with contact points of the first printed circuit board and leading through openings in the second printed circuit board as well as in the cover in an insulated manner; and
a third printed circuit board, the third printed circuit board (64) containing the control unit and is mechanically coupled with the bottom side of a cover (14) of the casing (12) and is electrically connected to the second printed circuit board (26) via a flat ribbon cable.

15. The converter control of claim 14, characterized in that the contact pins are approximately s-shaped in the bottom region.

16. The converter control of claim 14, characterized in that the contact pins (30) have an enlargement (34) between the ends, a frame (36) between the first and the second printed circuit board (24, 26) being supportable on it, the contact pins (30) extending into the upward direction through openings in the frame (36).

17. The converter control of claim 14, further comprising a third printed circuit board in electrical communication with the second printed circuit board and characterized in that the electrical connection between second and third printed circuit board (26, 64) takes place via a flat ribbon cable.

18. A converter control for low voltage three-phase motors for a driving system comprising a power unit containing transistors and capacitors, a triggering unit for the transistors, a control unit, and connections for direct and alternating current, the units being disposed in a common casing made of a heat conductive material characterized by the following features:
the power unit being provided with a first printed circuit board made of a fairly heat conductive material, which is disposed on the fairly heat conductive bottom of the casing in a plane fitting arrangement;
a second printed circuit board containing the triggering unit being electrically and mechanically connected to the first printed circuit board in a spacing to it with the aid of contact pins of metallic material attached on the first printed circuit board by soldering; and
terminal pins which are connected with contact points of the first printed circuit board and leading through openings in the second printed circuit board as well as in the cover in an insulated manner, and characterized in that the contact pins are approximately s-shaped in the bottom region.

19. The converter control of claim 18 characterized in that the contact pins (30) have an enlargement (34) between the ends, a frame (36) between the first and the second printed circuit board (24, 26) being supportable on it, the contact pins (30) extending into the upward direction through openings in the frame (36).

20. The converter control of claim 18, further comprising a third printed circuit board in electrical communication with the second printed circuit board and characterized in that the electrical connection between second and third printed circuit board (26, 64) takes place via a flat ribbon cable.

* * * * *